United States Patent [19]
Willer et al.

[11] Patent Number: 6,118,159
[45] Date of Patent: Sep. 12, 2000

[54] ELECTRICALLY PROGRAMMABLE MEMORY CELL CONFIGURATION

[75] Inventors: Josef Willer, Riemerling; Franz Hofmann, München; Hans Reisinger, Grünwald; Emmerich Bertagnolli; Bernd Göbel, both of München; Barbara Hasler, Stockdorf; Karl-Heinz Tietgen, München, all of Germany

[73] Assignee: Siemens Aktiengesellschaft, Munich, Germany

[21] Appl. No.: 09/259,376

[22] Filed: Feb. 26, 1999

[30] Foreign Application Priority Data

Feb. 26, 1998 [DE] Germany ............................ 198 08 182

[51] Int. Cl.$^7$ ........................... H01L 29/76; H01L 29/788
[52] U.S. Cl. ........................ 257/390; 257/314; 257/315; 257/316; 257/328; 257/329; 257/330
[58] Field of Search ................................... 257/390, 314, 257/315, 316, 328, 329, 330

[56] References Cited

U.S. PATENT DOCUMENTS 5,053,840  10/1991  Yoshikawa ............................... 257/390

FOREIGN PATENT DOCUMENTS 195 24 478 A1  1/1997  Germany .
196 00 423 A1  7/1997  Germany .

OTHER PUBLICATIONS

"A New Cell Structure for Sub–Quarter Micron High Density Flash Memory" (Yamauchi et al.), IEDM, 1995, pp. 267–270.

"A Novel NOR Virtual–Ground Array Architecture For High Density Flash" (Yamauchi et al.), 1996 International Conference on Solid State Devices and Materials, pp. 269–271; 1996.

"A 0.54$\beta$m$^2$ Self–Aligned, HSG Floating Gate Cell (SAHF Cell) for 256Mbit Flash Memories" (Shirai et al.), IEDM 1995, pp. 653–656; 1995.

German Published Application No. 195 244 478.8 (Hofmann et al.), dated Jul. 5, 1995, electrically erasable read–only memory cell configuration.

*Primary Examiner*—Minh Loan Tran
*Attorney, Agent, or Firm*—Herbert L. Lerner; Laurence A. Greenberg; Werner H. Stemer

[57] ABSTRACT

The memory cell configuration comprises vertical transistors which are connected in a NOR architecture. The vertical transistors are disposed on flanks of trenches. Each vertical transistor includes an electrically insulated floating gate electrode, whose charge can be varied by Fowler-Nordheim tunneling due to a voltage drop between a control gate electrode and a source/drain region. The length of a coupling area in a direction parallel to a channel width, between the control gate electrode and the floating gate electrode is less than the channel width, in order to reduce the operating voltage. This is achieved by thermal oxidation of parts of the flanks of the trenches. Transistors which are adjacent in a direction transverse to the trenches share bit lines. Each bit line has a lightly doped first part and a highly doped second part. The coupling area can be enlarged even further by using a strip-shaped mask, which is extended by spacers.

3 Claims, 5 Drawing Sheets

ELECTRICALLY PROGRAMMABLE MEMORY CELL CONFIGURATION

BACKGROUND OF THE INVENTION

Field of the Invention

The invention relates to an electrically programmable memory cell configuration, and to a method for producing an electrically programmable memory cell configuration.

An electrically programmable memory cell configuration, or so-called EEPROM configuration, has transistors which may each have at least two different threshold voltages. In order to read information, which is stored in one of the transistors, a voltage, which is between the two threshold voltages, is applied to a control gate electrode of the transistor. Depending on whether the threshold voltage of the transistor is less than or greater than the voltage on the control gate electrode, a current will or will not flow through the transistor. The information is stored in the form of the threshold voltage of the transistor and represents a logic variable "0" or "1".

In order to allow information to be stored, that is to say in order to make it possible to set the appropriate threshold voltage, an electrically insulated floating gate electrode is arranged between the control gate electrode and a channel region of the transistor. The threshold voltage of the transistor can be varied by varying the charge on the floating gate electrode. The charge on the floating gate electrode is varied by electrons which, due to a voltage drop between the control gate electrode and the channel region or a source/drain region of the transistor, tunnel through a thin dielectric or overcome the potential barrier of the dielectric. The term "floating gate electrode" refers to the fact that a floating gate electrode is not connected to a potential, and therefore "floats".

If, when voltage is applied, the electrons tunnel through the thin dielectric into the floating gate electrode, then this is referred to as Fowler-Nordheim tunneling (see S. M. Sze, Physics of Semiconductor Devices, J. Wiley & Sons, N.Y. 1981, page 497). If, on the other hand, storage is carried out on the basis of a high current through the transistor, that is to say if there is a high voltage drop between the source and the drain, then hot electrons can be injected into or out of the floating gate electrode. An injection mainly occurs in the vicinity of the drain region, since the voltage drop is particularly high there.

Transistors which are adjacent along a bit line can be connected in series (NAND architecture) or parallel (NOR architecture).

In VLSI (very-large-scale integration) technology, it is desirable to increase the packing density of circuit configurations, in order to reduce process costs and to increase switching speeds.

Published German patent application DE 19524478 A1 describes an EEPROM configuration using a NOR architecture, in which vertical MOS transistors are arranged on flanks of trenches which run parallel to one another in a substrate. The flanks are formed with a first dielectrics. Bit lines run along the bottoms of the trenches and between the trenches, and word lines run transversely with respect to the bit lines. Floating gate electrodes and control gate electrodes, which are separated by second dielectrics from the floating gate electrodes, are arranged in the trenches. In order to keep any voltage drop between the control gate electrodes and the floating gate electrodes small, and thus to reduce the operating voltage, the extent of the floating gate electrodes in the vertical direction is greater than the depth of the trenches, and the floating gate electrodes project beyond a main surface of the substrate. The packing density is not reduced by the vertical extent. However, the structure of the floating gate electrodes reduces the process reliability, since the thin projecting parts of the floating gate electrodes are not mechanically robust. A cell area of $2F^2$ can be achieved with this configuration, where F is the minimum structure size which can be produced lithographically using the respective technology.

According to published German patent application DE 19524478 A1, in the case of Fowler-Nordheim tunneling, two transistors in an EEPROM configuration, which share a bit line, would be programmed at the same time and therefore, such an EEPROM configuration could be programmed only by the injection of hot electrons. In this case, a part of the bit lines are at one potential and another part of bit lines are at a different potential, with a voltage drop being present between adjacent bit lines only for the transistor that is to be programmed. Programming by injection of hot electrons is disadvantageous since high programming currents, and thus high power levels, are required.

The article "A Novel NOR Virtual-Ground Array Architecture for High Density Flash", by Y. Yamauchi et al., in the Extended Abstracts of the 1996 International Conference on Solid State Devices and Materials, Yokohama, 1996, pages 269 to 271, proposes an EEPROM configuration with planar transistors and using NOR architecture in which programming can be carried out via Fowler-Nordheim tunneling despite adjacent transistors having common bit lines. For this purpose, the bit lines each have a first section and a second section with the first section being doped at a lower concentration than the second section. Since there is a voltage drop to the tunnel oxide in the first part of a bit line, only the floating gate electrode which is adjacent to the second part of the bit line is programmed. A cell area of $5F^2$ can be achieved with this configuration.

In order to keep any voltage drop between the control gate electrode and the floating gate electrode small, and thus to reduce the operating voltage, H. Shirai et al. propose a memory cell configuration in the article "A 0.54 $\mu m^2$ Self-Aligned, HSG Floating Gate Cell (SAHF Cell) for 256 Mbit Flash Memories", IEDM, Technical Digest, IEEE, New York, 1995, pages 653 to 656. In this memory cell configuration the capacitance which is formed by the control gate electrode and the floating gate electrode is increased by using hemispherical-grained polysilicon as the material for the floating gate electrode. The hemispherical-grained polysilicon provides an increased surface area of the floating gate electrode and thus an increased coupling area between the floating gate electrode and the control gate electrode.

SUMMARY OF THE INVENTION

It is accordingly an object of the invention to provide an electrically programmable memory cell configuration, in which MOS transistors are connected using a NOR architecture, and which can be produced with a packing density that is particularly high in comparison to the prior art, and that has a particularly high process reliability. Furthermore, it is an object of the invention to provide a method for producing such an electrically programmable memory cell configuration.

With the foregoing and other objects in view there is provided, in accordance with the invention, an electrically programmable memory cell configuration, comprising a substrate with trenches formed therein, the trenches disposed substantially parallel to one another and having bottoms, first flanks and second flanks, the first flanks disposed opposite the second flanks; lower bit lines running along the bottoms of the trenches; upper bit lines disposed between and adjacent to respective neighboring two of the trenches; each of the lower bit lines and each of the upper bit lines having a first part and a second part, the first part disposed parallel and adjacent to the second part, the first part and the second part each having a dopant concentration, the dopant concentration of the second part being higher than the dopant concentration of the first part, the second part of each of the lower bit lines disposed in a region of a respective one of the first flanks, the second part of each of the upper bit lines disposed adjacent to a respective one of the second flanks; word lines disposed transversely with respect to the trenches in the substrate; vertical MOS transistors having channel regions and soure/drain regions, the source/drain regions each formed of one of a part of a respective one of the upper bit lines and a part of a respective one of the lower bit lines, respective two of the vertical MOS transistors disposed next to each other along a respective one of the word lines and sharing one of a respective one of the lower bit lines and a respective one of the upper bit lines; floating gate electrodes separated from each other and disposed on the first flanks and the second flanks; first dielectrics separating the floating gate electrodes from the channel regions of the vertical MOS transistors; control gate electrodes electrically connected to the word lines, the control gate electrodes being separated from each other and disposed next to each other along a respective one of the trenches; and second dielectrics separating the control gate electrodes from the floating gate electrodes.

In accordance with a further feature of the invention, there are insulating structures disposed adjacent to one of the first flanks and the second flanks and disposed between the first dielectrics, the first dielectrics disposed next to each other along the trenches, the floating gate electrodes overlapping the insulating structures; the channel regions each having a channel region width, the floating gate electrodes and the control gate electrodes having dimensions in a direction parallel to paths of the trenches, the channel region width of the MOS transistors being smaller than the dimensions of the floating gate electrodes and of the control gate electrodes; and the control gate electrodes extending into the trenches.

In accordance with another feature of the invention, the floating gate electrodes and the control gate electrodes have dimensions in a direction parallel to paths of the trenches, the dimensions of the control gate electrodes and of the floating gate electrodes being larger than a distance between respective two of the control gate electrodes next to each other along the trenches.

With the foregoing and other objects in view there is also provided, in accordance with the invention, a method for producing an electrically programmable memory cell configuration, the method comprises the steps of providing a substrate; forming mutually substantially parallel trenches with bottoms, first flanks, and second flanks opposite the first flanks in the substrate; forming lower bit lines running along the bottoms of the trenches; forming upper bit lines disposed between the trenches and adjacent to respective neighboring two of the trenches; forming, parallel to the trenches, a first part and, adjacent to the first part, a second part in each of the upper bit lines and each of the lower bit lines by forming the second part of each of the lower bit lines in a respective region of each of the first flanks and by forming the second part of each of the upper bit lines adjacent to a respective one of the second flanks; providing a dopant concentration in the first part and providing a dopant concentration in the second part, the dopant concentration in the first part being lower than the dopant concentration in the second part; providing first dielectrics on at least parts of the first and second flanks of the trenches; providing, adjacent to the first dielectrics, mutually separated floating gate electrodes on parts of the first flanks and on parts of the second flanks; forming control gate electrodes on the substrate; forming second dielectrics and separating the control gate electrodes from the floating gate electrodes with the second dielectrics; and forming word lines transverse to the trenches and connecting the word lines to the control gate electrodes.

In accordance with a further feature of the invention, a doped layer is formed in the substrate having a first dopant concentration of a given conductivity type; by masked implantation, strip-shaped doped regions are formed having a second dopant concentration of the given conductivity type, the second dopant concentration being higher than the first dopant concentration; the trenches are formed by masked etching such that the trenches run parallel to and offset with respect to the strip-shaped doped regions and that the trenches cut through the doped layer and the strip-shaped doped regions; the first part of each of the upper bit lines from the doped layer are formed; the second part of each of the upper bit lines are formed from the strip-shaped doped regions; the first part of each of the lower bit lines are formed by implanting, with a third dopant concentration, the bottoms of the trenches using a mask covering the upper bit lines and at least the first flanks of the trenches; the second part of each of the lower bit lines are formed in the respective region of each of the first flanks and adjacent a respective one of the bottoms of the trenches by a subsequent additional implantation, and the second part of each of the lower bit lines are provided with a fourth dopant concentration, the fourth dopant concentration being higher than the third dopant concentration of the first part of each of the lower bit lines due to a shading effect of the second flanks of the trenches preventing the additional implantation in a region of the first part of each of the lower bit lines.

In accordance with another feature of the invention, insulating structures are formed adjacent to the first flanks and adjacent to the second flanks of the trenches, the insulating structures separating the first dielectrics from one another after the memory cell configuration has been produced; and the floating gate electrodes and the control gate electrodes are formed such that the floating gate electrodes and the control gate electrodes overlap the insulating structures.

In accordance with a further feature of the invention, the insulating structures are formed by a thermal oxidation, using a strip-shaped mask with strips transverse with respect to the trenches, the insulating structures extending as far as underneath a part of the strip-shaped mask due to a diffusion under the strip-shaped mask.

In accordance with a yet a further feature of the invention, there are provided the steps of forming, prior to providing the floating gate electrodes, a first auxiliary layer; forming a second auxiliary layer on top of the first auxiliary layer; structuring the first auxiliary layer and the second auxiliary layer for forming the strips of the strip-shaped mask from the first auxiliary layer; narrowing the strips of the strip-shaped mask by underetching the second auxiliary layer with an isotropical etching which is selective with respect to the second auxiliary layer.

In accordance with another feature of the invention, there are provided the steps of depositing conductive material after forming the second dielectrics; depositing a first material and producing strips with a photolithographic structuring process, the strips having widths equal to distances between the strips; forming spacers along both sides of the strips by depositing a second material and etching back the second material; forming a word line mask with the strips and the spacers; forming the word lines by etching the conductive material with the aid of the word line mask; and forming the control gate electrodes as parts of the word lines.

A memory cell configuration according to the invention comprises at least a part of a substrate in which trenches, which run essentially parallel to one another, are provided. Lower bit lines run along the bottoms of these trenches. Upper bit lines, which are each adjacent to two mutually adjacent trenches, run between the trenches. The upper bit lines are arranged, for example, adjacent to a surface of the substrate or, alternatively, in a conductive layer which is produced over the substrate. The upper and lower bit lines may be formed of semiconductor material and may be enhanced by a silicide in order to reduce their electrical resistance. Word lines run transversely with respect to the upper and lower bit lines.

A memory cell in the memory cell configuration comprises a vertical MOS transistor, which is formed on one flank of one of the trenches. Two MOS transistors, which are adjacent along one of the word lines and which belong to different memory cells, are arranged either on opposite flanks of one of the trenches or on flanks of adjacent trenches. Two MOS transistors which are adjacent along the word line and which are arranged on opposite flanks of the trench share one of the lower bit lines. Two MOS transistors which are adjacent along the word line and which are arranged on flanks of the adjacent trenches share one of the upper bit lines. Parts of the upper and lower bit lines act as source/drain regions for the MOS transistors. A channel region is arranged between source/drain regions of the MOS transistor. At least in the area of the channel region, the associated flank of the trench is provided with a first dielectric. A floating gate electrode of the MOS transistor is adjacent to the first dielectric. Floating gate electrodes of different MOS transistors are separated from one another. Control gate electrodes are separated by second dielectrics from the floating gate electrodes and are electrically connected to the word lines. The control gate electrodes may be parts of the word lines, may be adjacent to or in contact with the word lines or, may be connected via contacts to the word lines. Control gate electrodes of transistors, which are adjacent along a trench, are separated from one another.

In order to keep programming currents as small as possible, it is advantageous if the programming is carried out by Fowler-Nordheim tunneling. When the MOS transistor is being programmed via Fowler-Nordheim tunneling, the word line of the MOS transistor is connected to a first voltage, and a bit line of the MOS transistor is connected to a second voltage. No voltage is applied to the other bit lines, that is to say they float. In order to avoid that a second MOS transistor, which is adjacent to a first MOS transistor along the word line and which shares the same bit line, is programmed together with the first transistor, the upper and lower bit lines comprise first parts which run along first flanks of the trenches and second parts which run along second flanks of the trenches. The dopant concentration in the first parts is lower than in the second parts. Since the dopant concentration in the first parts of the bit lines is low, there is a voltage drop toward the first dielectric even within the first part of the bit line when the MOS transistor is being programmed. The doping levels are selected such that the voltage drop between the opposite surfaces of the first dielectric is not sufficient to initiate tunneling in the first part of the bit line. The second part of the bit line can thus be assigned to the MOS transistor, while the first part of the bit line can be assigned to the adjacent MOS transistor.

MOS transistors which are arranged on the first flanks of the trenches comprise a first part of one of the upper bit lines and a second part of one of the lower bit lines. MOS transistors which are arranged on the second flanks of the trenches comprise a first part of one of the lower bit lines and a second part of one of the upper bit lines.

The memory cell can be produced with an area of $2F^2$.

The upper bit lines can be produced by producing a doped layer before making the trenches. The doped layer may, for example, be grown epitaxially on the substrate, or may be produced by implantation of the substrate. Additional implantation is then used to produce doped regions in the form of strips, which are doped with the same conductivity type as the doped layer, but whose dopant concentration is higher. The doped layer can also be produced after producing the doped regions which are in the form of strips. Then the trenches are produced. The trenches run parallel to and offset with respect to the doped regions which are in the form of strips. Each trench cuts through a part of one of the doped regions which are in the form of strips, and through a part of the doped layer. In order to achieve this, it is advantageous if the sum of the widths of the trenches and of the distances between adjacent trenches is equal to the sum of the widths of the strip-shaped doped regions and the distances between mutually adjacent strip-shaped regions. In order to increase the packing density, it is advantageous if the width of the trenches, the distance between the adjacent trenches, the width of the regions which are in the form of strips, and the distance between the mutually adjacent doped regions which are in the form of strips are each equal to F.

The production of the trenches results in the first parts of the upper bit lines being formed from the remaining parts of the doped layer, and in the second parts of the upper bit lines being formed from the remaining parts of the regions which are in the form of strips. This process has the advantage that the width of the first parts and of the second parts of the upper bit lines may be less than F, for example F/2, which results in a high packing density.

The first parts and/or the second parts of the upper bit lines may also be produced after producing the trenches.

The lower bit lines may be produced by first carrying out an implantation of the bottoms of the trenches, after the trenches have been produced. If the upper bit lines have been produced already, then a mask covers the upper bit lines, in which case, in order to simplify the process, at least part of the mask has preferably been used as a mask for producing the trenches. Since an additional oblique implantation is then carried out, it is advantageous if the mask also covers at least the first flanks of the trenches, in order to protect them against the additional implantation. The direction of the additional implantation is chosen such that the bottoms are additionally implanted only in the area of first flanks of the trenches. This results in the more strongly doped second parts of the lower bit lines in these areas. During the additional implantation, the second flanks have a shading effect. The bottoms are therefore not additionally implanted in the areas of the second flanks of the trenches and thus the first parts of the lower bit lines, which are doped with a low concentration, are produced there. The sequence of implantation is irrelevant.

Instead of oblique implantation, implantation can also be carried out with the aid of a mask in the form of strips, with the strips running parallel to the trenches and covering the bottoms in areas of the second flanks of the trenches.

It is advantageous if any voltage difference between a control gate electrode of the MOS transistor and the channel region drops mainly across a capacitance which is formed by the floating gate electrode and the channel region. For this purpose, the capacitance which is formed by the floating gate electrode and the channel region must be less than a capacitance which is connected in series with it and is formed by the control gate electrode and the floating gate electrode. A surface between the floating gate electrode and the channel region should accordingly be smaller than a coupling area between the control gate electrode and the floating gate electrode. Since any increase in the coupling area parallel to the path of the word lines would lead, as a result of broadening the trenches and the distances between them, to a reduction in the packing density, it is advantageous to provide the increase in the coupling area along the flank of the trench.

It is advantageous if the trenches are not filled and the control gate electrodes extend into the trenches, since this increases the coupling area.

It is thus advantageous if the channel width, that is to say a dimension of the channel region and/or of the first dielectric of the MOS transistor parallel to the path of the trench, is smaller than a dimension of the floating gate electrode and of the control gate electrode parallel to the path of the trench. In order to prevent that the enlargement of the floating gate electrode along the flank of the trench leads to an increase in the channel width, insulating structures are arranged between first dielectrics, which are adjacent along the trench. The insulating structures are adjacent to parts of the flanks of the trenches, where they prevent channel formation. Outside of the channel regions, the floating gate electrodes overlap the insulating structures.

For example, insulating material is structured in the form of a spacer by depositing and etching back and is then structured further with the aid of a mask in the form of strips, whose strips are thinner than the distances between the strips and run transversely with respect to the trenches. Thus the insulating structures, in the form of spacers, are produced from the insulating material.

In order to increase the packing density it is however advantageous to carry out thermal oxidation before producing the floating gate electrodes with the aid of a mask which is in the form of strips and whose strips run transversely with respect to the trenches. Since oxygen diffuses underneath the mask, the insulating structures are also formed underneath a part of the mask. In this way, it is possible to produce distances between the insulating structures, that is to say the channel widths, of less than the minimum structure size F.

In order to reduce the channel width even further, it is advantageous to narrow the strips of the strip-shaped mask before the thermal oxidation. To this end it is possible, for example, before producing the floating gate electrodes, to produce a first auxiliary layer and a second auxiliary layer above it, which are structured in the form of strips. The mask, which is in the form of strips, is thus produced from the first auxiliary layer. The strips of the strip-shaped mask are narrowed by an isotropic etching of the material of the first auxiliary layer, the etching being selective with respect to the second auxiliary layer and resulting in an etching underneath the structured second auxiliary layer. Thus the widths of the strips of the strip-shaped mask may be less than F.

The invention allows for the upper and the lower bit lines to be produced at the same time. For example, once the trenches have been produced, implantation is carried out over the whole area, and a further implantation is carried out with the aid of a mask in the form of strips, whose strips are arranged either between the trenches and adjacent to the first flanks of the trenches, or in the trenches and adjacent to the second flanks of the trenches. The implantation sequence is irrelevant.

In order to simplify the process, it is advantageous if adjacent control gate electrodes are adjacent to one another along the word line and form the word line.

In order to increase the packing density, it is advantageous if distances between control gate electrodes which are adjacent along the trench are less than their widths, that is to say their dimensions parallel to the path of the trench. It is particularly advantageous if the distances between the control gate electrodes which are adjacent along the trench are less than F.

In order to produce the control gate electrodes, conductive material may be deposited once the second dielectrics have been produced. The conductive material is structured with the aid of a word line mask which is in the form of strips. In order to produce the word line mask, material is deposited and is structured in the form of strips using a photolithographic method. In order to increase the packing density, the widths of the strips are preferably equal to the distances between the strips, whose size is equal to F. Further material is then deposited and etched back, so that spacers are produced on the flanks of the strips. The strips and the spacers together form the word line mask.

In order to simplify the process, it is advantageous if the word line mask also acts as a mask for producing the second dielectrics and the floating gate electrodes.

The second dielectrics are produced, for example, by structuring an ONO layer (oxide nitride oxide layer), that is to say a layer which is composed of two oxide sublayers with a silicon nitride sublayer arranged between them. However, the second dielectrics can also be produced from other insulating materials.

Other features which are considered as characteristic for the invention are set forth in the appended claims.

Although the invention is illustrated and described herein as embodied in an electrically programmable memory cell configuration, and a method for producing such an electrically programmable memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
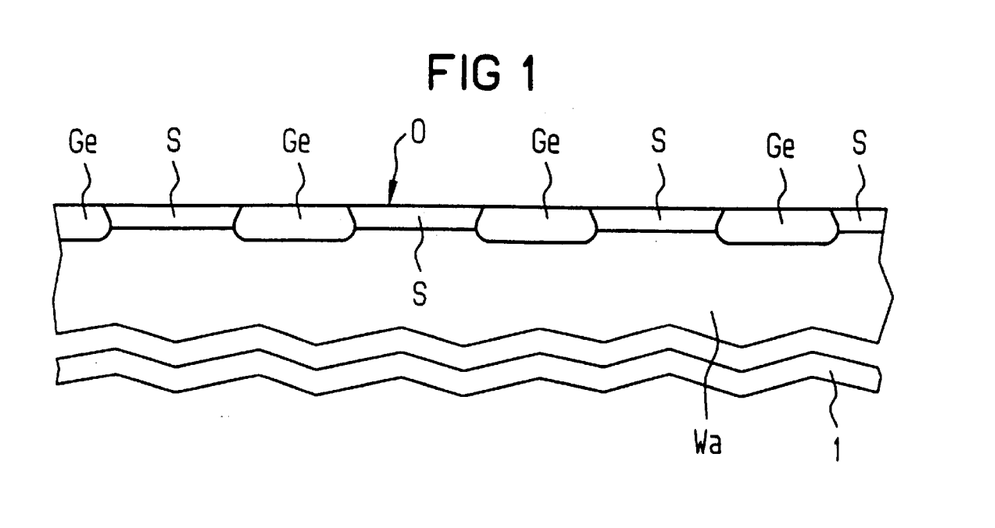
FIG. 1 is a cross-sectional view of a first substrate after a well, a doped layer and strip-shaped doped regions have been produced.

In a first exemplary embodiment, a first substrate 1 is provided which is composed of silicon and comprises a p-doped well Wa adjacent to a surface O of the first substrate 1. The dopant concentration in the well Wa is about $10^{17}$ cm$^{-3}$. A doped layer S is produced by implantation with n-doped ions. This doped layer S has a thickness of about 80 nm and has a dopant concentration of about $5*10^{18}$ cm$^{-3}$ (see FIG. 1). FIG. 1 shows strip-shaped n-doped regions Ge having a width of about 400 nm and being produced by implantation using a photoresist mask (not illustrated). The strip-shaped doped regions Ge are disposed at a distance of about 400 nm from one another. Their doping concentration is about $5*10^{20}$ cm$^{-3}$.

In order to produce a first mask M1, which is in the form of strips and whose strips run parallel to one another with a width of about 400 nm and with a distance of about 400 nm between them, SiO$_2$ is deposited with a thickness of about 200 nm and is structured by means of a photolithographic method. CHF$_3$ is used, for example, as the etching agent for a structuring by dry etching. The strips of the first mask M1 run parallel to the strip-shaped doped regions Ge, and overlap a respective strip-shaped doped region Ge and part of the doped layer S (see FIG. 2).

Figure 2:
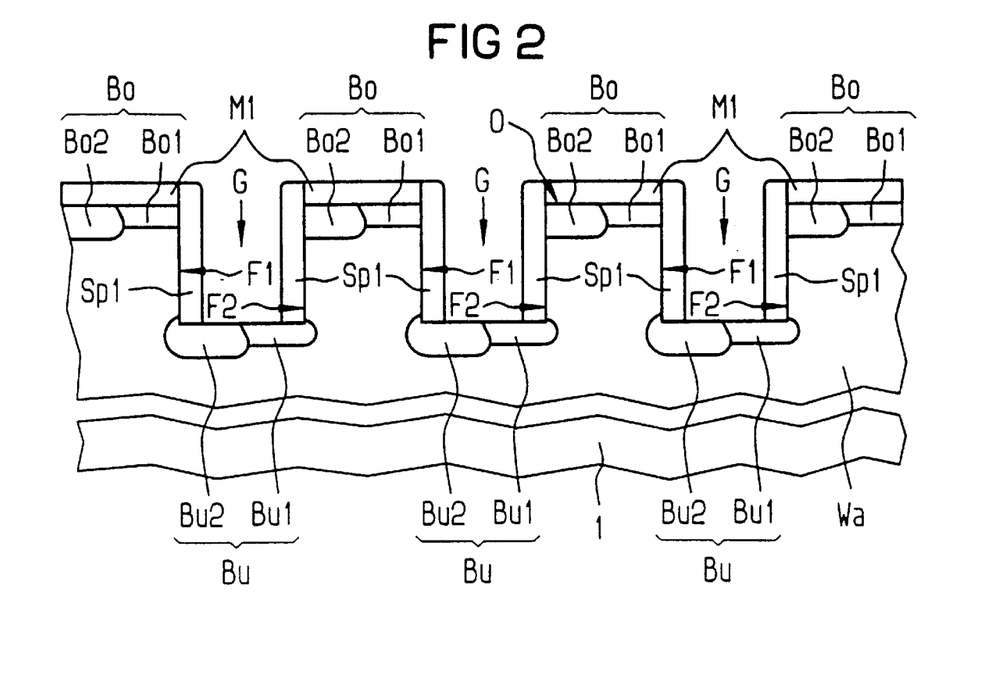
FIG. 2 is a cross-sectional view of the substrate of FIG. 1, after a strip-shaped first mask, trenches, first parts of upper bit lines, second parts of the upper bit lines, first spacers, first parts of lower bit lines and second parts of the lower bit lines have been produced.

In order to produce trenches G, silicon is etched, using for example HBr, to a depth of about 600 nm with the aid of the first strip-shaped mask M1 (see FIG. 2). In this case, the doped layer S is used to produce first parts of upper bit lines Bo1, which are adjacent to first flanks F1 of the trenches G. The strip-shaped doped regions Ge are used to produce second parts of the upper bit lines Bo2, which are adjacent to second flanks F2 of the trenches G. An upper bit line Bo runs in each case between two adjacent trenches G (see FIG. 2).

In order to produce first spacers Sp1, SiO$_2$ is deposited with a thickness of about 50 nm on the first flanks F1 and on the second flanks F2 of the trenches G and is then etched back (see FIG. 2). The first spacers Sp1 and the strip-shaped first mask M1 together form a second mask, which does not cover the bottoms of the trenches G. SiO$_2$ is deposited with a thickness of about 15 nm in order to produce a scatter oxide (not illustrated).

In order to produce first parts of lower bit lines Bu1, the bottoms of the trenches G are implanted with n-doped ions with the aid of the second mask (see FIG. 2). The dopant concentration of the first parts of the lower bit lines Bu1 is about $5*10^{18}$ cm$^{-3}$. In order to produce second parts of the lower bit lines Bu2, oblique implantation is then carried out with n-doped ions. The first spacers Sp1 of the second mask in this case protect the first flanks F1 of the trenches G. As a result of the shading effect of the second flanks F2 of the trenches G, the bottoms of the trenches G are not additionally implanted in the area of the second flanks F2. The second parts of the lower bit lines Bu2, which result from the additional implantation, are formed in the area of the first flanks F1 of the trenches G and have a dopant concentration of about $5*10^{20}$ cm$^{-3}$ (see FIG. 2). The dopant in the lower bit lines Bu is activated by a tempering step. A lower bit line Bu runs along the bottoms of each of the trenches G.

The second mask and the stray oxide are then removed, for example using hydrofluoric acid. A roughly 10 nm thick SiO$_2$ layer I1 is formed by thermal oxidation (see FIG. 3). The SiO$_2$ layer I1, which will later be removed, is used to remove etching damage from the surfaces of the trenches G.

Figure 3:
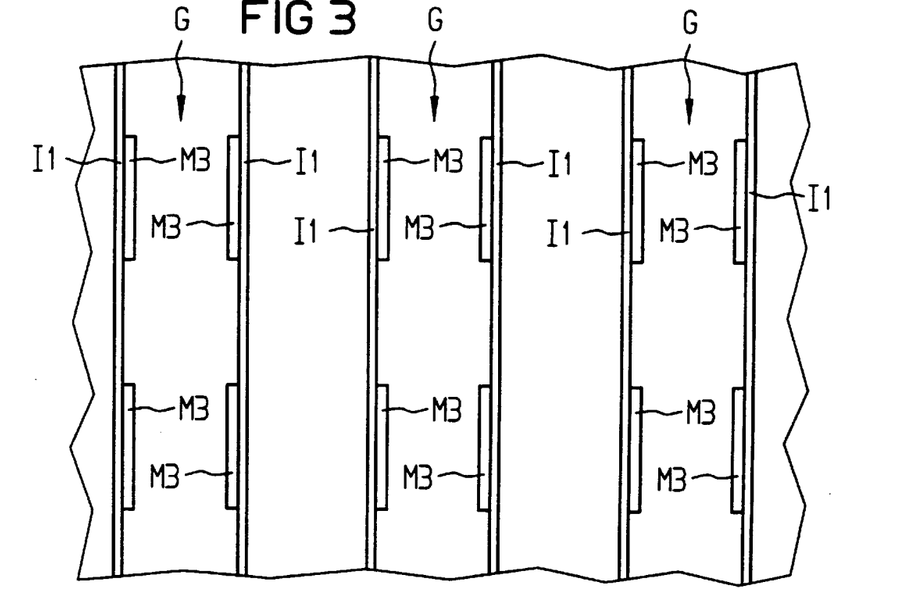
FIG. 3 is a cross-sectional view of the substrate, the cross-section being parallel to a surface of the substrate and cutting through the trenches, after an SiO$_2$ layer and a third strip-shaped mask have been produced.

After this, in order to produce a strip-shaped third mask M3 whose strips run essentially at right angles to the trenches G and are about 400 nm wide and have a distance of about 400 nm between them, silicon nitride is deposited with a thickness of about 50 nm, and is structured by means of a photolithographic method using, for example, CF$_4$ as the etching agent (see FIG. 3). The SiO$_2$ layer I1 is in this case used as an etching resist or so-called etch stop, and is partially etched away. Furthermore, it protects the substrate 1 from making contact with the silicon nitride.

Figure 4:
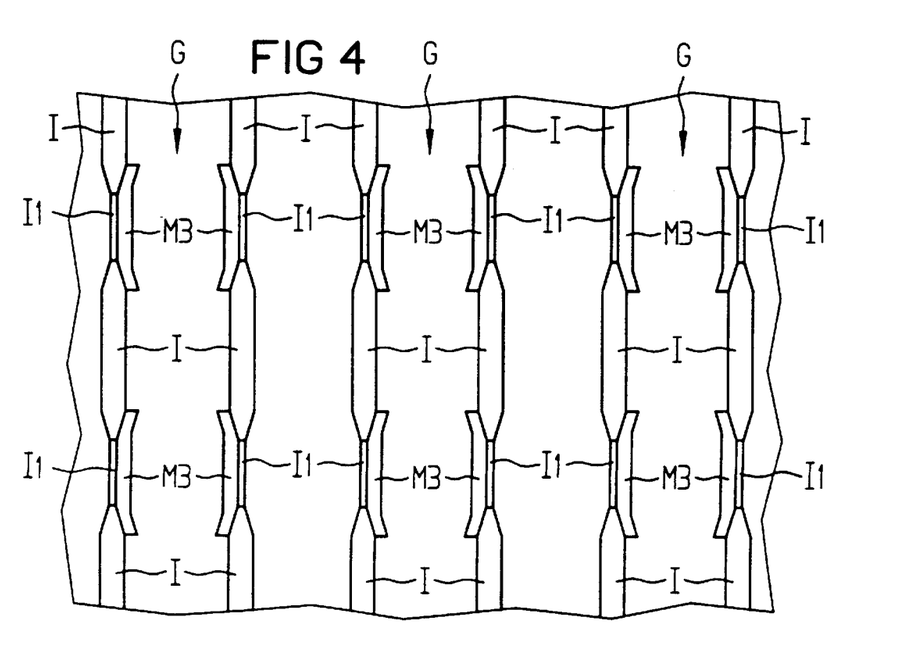
FIG. 4 is a cross-sectional view of the substrate of FIG. 3, after insulating structures have been produced.

A thermal oxidation is then carried out at about 1000° C., in order to produce insulating structures I. As a result, the insulating structures I are formed on the first flanks F1 and on the second flanks F2 of the trenches G. These insulating structures I have a thickness of about 70 nm and extend to a depth of about 140 nm into the strips of the third mask M3 as a result of oxygen diffusing underneath the strip-shaped third mask M3 (see FIG. 4). The third mask M3 is somewhat oxidized in the process. A dimension of the insulating structures I parallel to the trenches G is about 680 nm. The distances between insulating structures I, which are adjacent along the trenches G, are about 120 nm. The SiO$_2$ layer I1 is partially incorporated into the insulating structures I.

Oxidized silicon nitride is then etched isotropically to a depth of about 20 nm using, for example, dilute hydrofluoric acid, until silicon nitride of the strip-shaped third mask M3, is exposed. The strip-shaped third mask M3 is removed using, for example, H$_3$PO$_4$.

In order to remove the SiO$_2$ layer I1, SiO$_2$ is etched isotropically to a depth of about 15 nm using, for example, dilute hydrofluoric acid. The insulating structures I are now about 55 nm thick.

In order to produce first dielectrics D1 which are about 8 nm thick and act as tunnel oxides, SiO$_2$ is grown by thermal oxidation. The first dielectrics D1 are produced between the insulating structures I on the first flanks F1 and on the second flanks F2 of the trenches G (see FIGS. 5a and 5b). Since the second parts of the lower bit lines Bu2 and the second parts of the upper bit lines Bo2 are doped with a higher dopant concentration than the first parts of the lower bit lines Bu1, the first parts of the upper bit lines Bo1 and the well Wa, the first dielectrics D1 are somewhat thicker in the first-mentioned areas (see FIG. 5a).

In order to produce floating gate electrodes Gf, doped polysilicon is deposited with a thickness of about 50 nm in situ and is etched back using, for example, HBr until the doped polysilicon covers only the first flanks F1 and the second flanks F2 of the trenches G.

In order to produce second dielectrics D2, about 3 nm of $SiO_2$ is initially grown by thermal oxidation. Silicon nitride is then deposited with a thickness of about 10 nm, and is oxidized until an oxide-equivalent thickness of 15 nm is obtained.

Figure 5A:
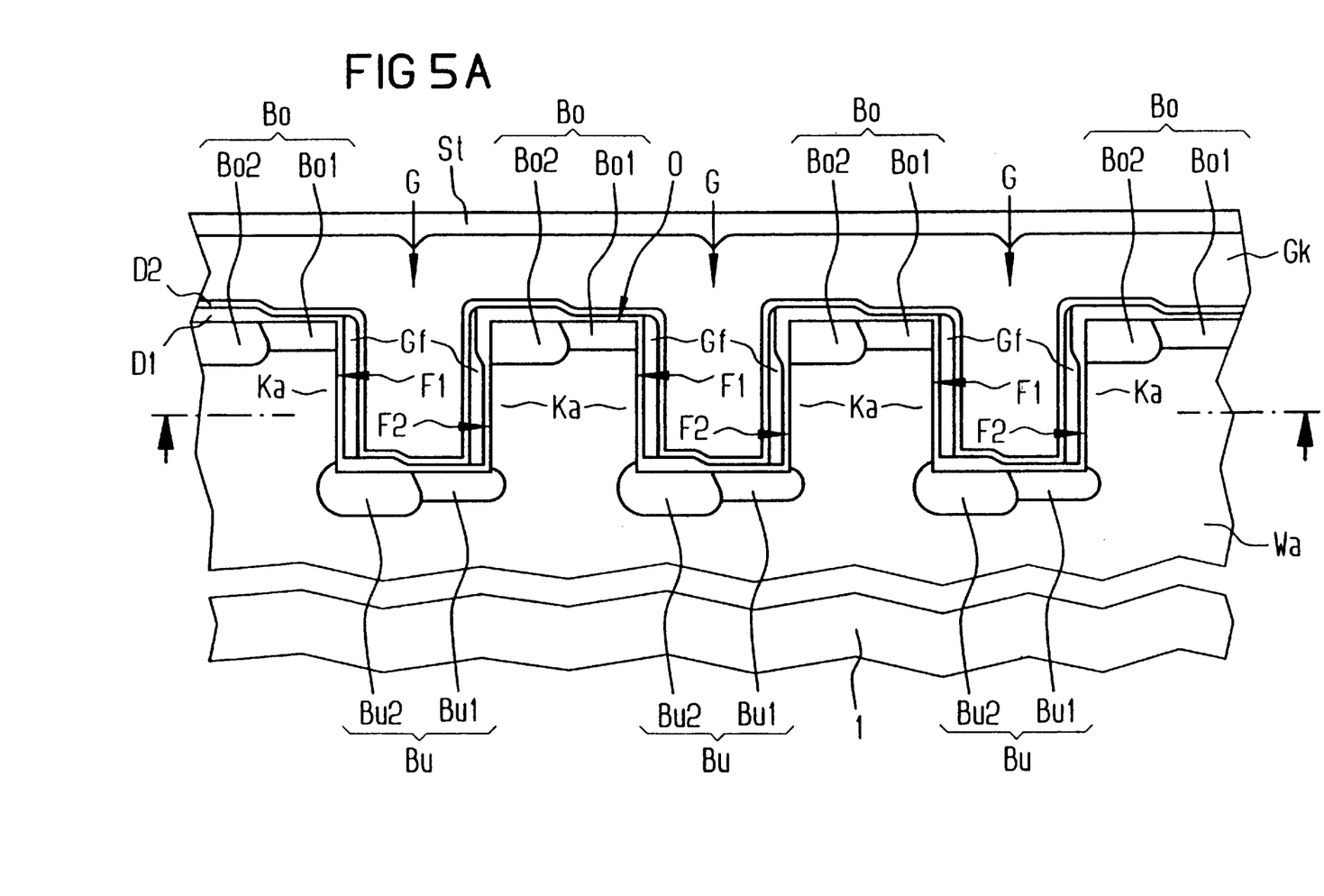
FIG. 5a is a cross-sectional view of the substrate of FIG. 2, after the SiO$_2$ layer has been removed and first dielectrics, floating gate electrodes, second dielectrics and control gate electrodes have been produced.
Figure 5B:
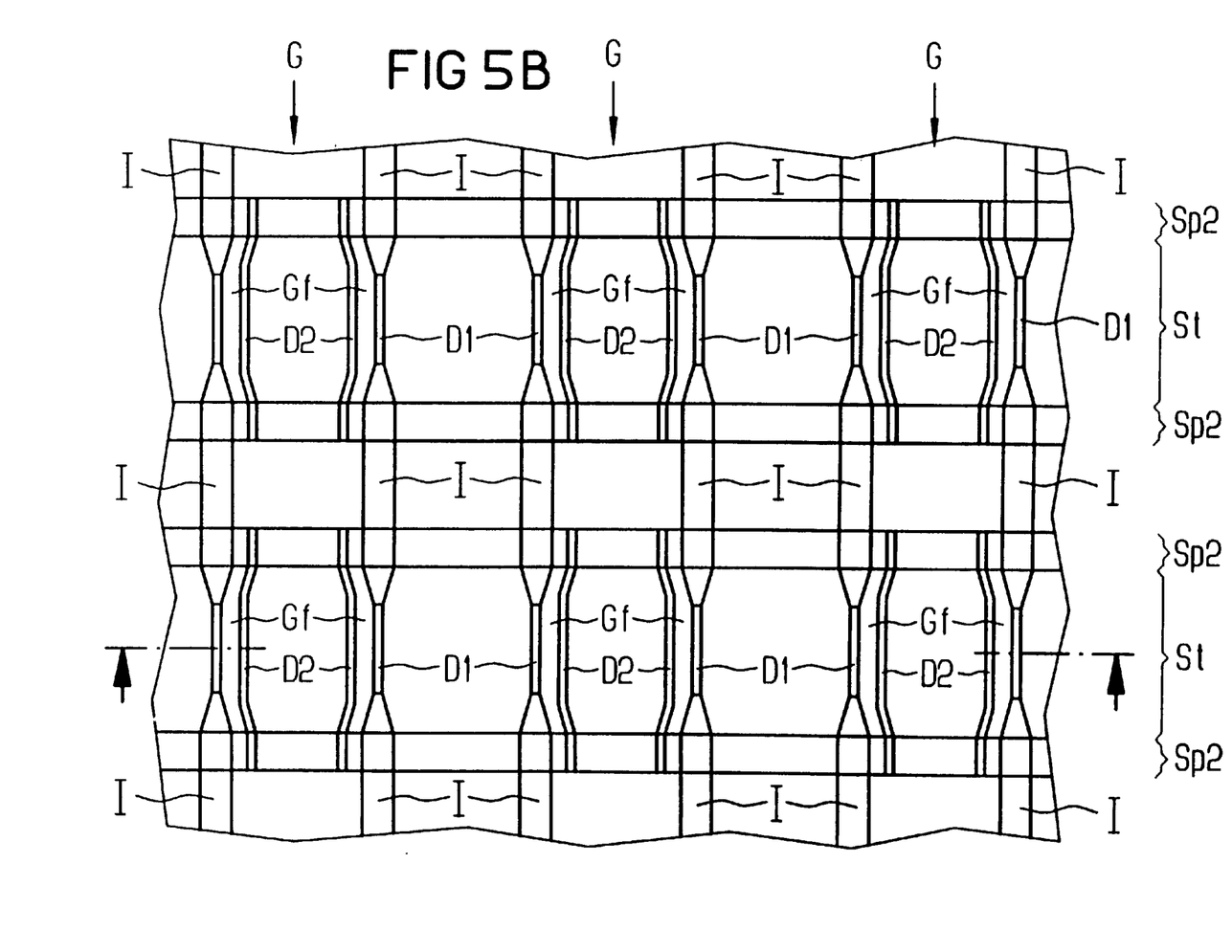
FIG. 5b is a cross-sectional view of the substrate of FIG. 4 after the process steps illustrated by FIG. 5a have been performed, the path of strips and second spacers being illustrated as a projection.

In order to produce control gate electrodes Gk, doped polysilicon is then deposited in situ with a thickness of about 400 nm, thus filling the trenches G (see FIG. 5a).

In order to produce a word line mask, $SiO_2$ is deposited with a thickness of about 100 nm and is structured by means of a photolithographic method such that strips St which are analogous to the third mask M3 are produced. The strips St are broadened by subsequently depositing $SiO_2$ with a thickness of about 80 nm and etching back the $SiO_2$. As a result, second spacers Sp2 are produced on flanks of the strips St. The strips St and the second spacers Sp2 together form the word line mask (see FIG. 5b).

With the aid of the word line mask, polysilicon is first of all etched to a depth of about 1000 nm using, for example, HBr. As a result, word lines are produced which run transversely with respect to the trenches G and are at the same time used as control gate electrodes Gk. Oxidized silicon nitride is then removed using, for example, HF and silicon nitride is etched to a depth of about 10 nm using, for example, $CF_4$ while $SiO_2$ is etched to a depth of about 3 nm using, for example, HF. As a result, the second dielectrics D2 are produced. Polysilicon is then etched anisotropically to a depth of about 600 nm using, for example, HBr. As a result, the floating gate electrodes Gf, which are separated from one another, are produced.

A vertical transistor comprises one of the first dielectrics D1, a floating gate electrode Gf adjacent to it, a part of one of the second dielectrics D2 adjacent to it, and a control gate electrode Gk adjacent to this part. Furthermore, the transistor comprises a part of the well Wa which is adjacent to the first dielectric D1 and acts as a channel region Ka, as well as parts of an upper bit line Bo and of a lower bit line Bu which are adjacent to the first dielectric D1 and act as source/drain regions. Neighboring transistors which are arranged on opposite flanks F1, F2 of one of the trenches G share a lower bit line Bu. Neighboring transistors, which are arranged on flanks F1, F2 of neighboring trenches G, share an upper bit line Bo.

In a second exemplary embodiment, as in the first exemplary embodiment, trenches G', upper bit lines, lower bit lines and an $SiO_2$ layer I1' are produced in a second substrate composed of silicon.

Figure 6:
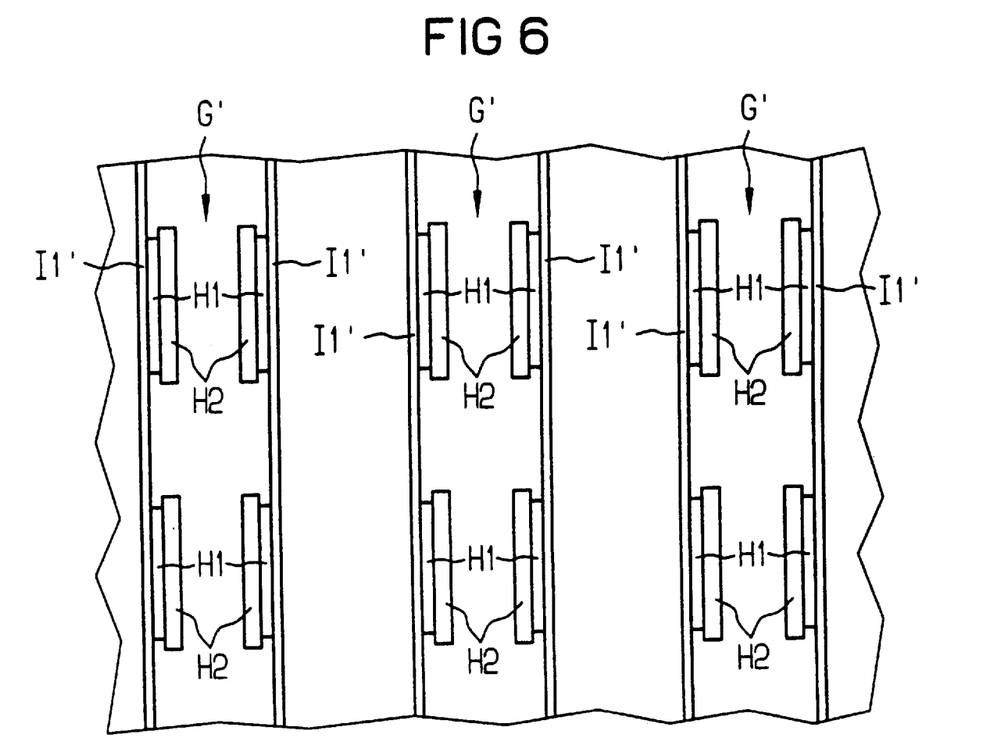
FIG. 6 is a cross-sectional view of a second substrate, the cross-section being parallel to a surface of the second substrate, after upper and lower bit lines (not illustrated) and trenches have been produced, and a first and a second auxiliary layer have been structured.

In order to produce a strip-shaped mask, a first auxiliary layer H1 is produced by depositing silicon nitride with a thickness of about 50 nm. A second auxiliary layer H2 is produced on top of this first auxiliary layer H1, by depositing $SiO_2$ with a thickness of about 50 nm. A photolithographic method is used to etch the silicon nitride and $SiO_2$, by which means the first auxiliary layer H1 and the second auxiliary layer H2 are structured into strips having a width of about 400 nm, which are at a distance of about 400 nm from one another and run essentially at right angles to the trenches G'. Silicon nitride is then isotropically etched using, for example, $CF_4$. In the process, the etching penetrates underneath the structured second auxiliary layer H2, and the strips of the first auxiliary layer H1 are narrowed to a width of about 300 nm (see FIG. 6).

The second auxiliary layer H2 is then removed by isotropic etching using, for example, dilute hydrofluoric acid.

The structured first auxiliary layer H1 is used as a mask, which is analogous to the third mask M3 in the first exemplary embodiment, for producing insulating structures.

First dielectrics, floating gate electrodes, second dielectrics and control gate electrodes are then produced in an analogous manner to that in the first exemplary embodiment.

Since the strips of the first auxiliary layer H1 are narrower than the strips of the third mask M3 in the first exemplary embodiment, the channel width of a transistor, that is to say a dimension of a channel region parallel to the trenches G', is smaller than that of the transistor in the first exemplary embodiment. This means that a capacitance which is formed by the channel region and the floating gate electrode is larger than in the case of the first exemplary embodiment. Since a coupling capacitance between the floating gate electrode and the control gate electrode is connected in series with the capacitance which is formed by the channel region and the floating gate electrode, a greater proportion of the operating voltage drops across the latter capacitance than in the case of the first exemplary embodiment. The threshold voltage required for electrons to tunnel through the first dielectrics is thus reached at a lower operating voltage in the second exemplary embodiment than in the first exemplary embodiment.

Many variations of the exemplary embodiments are feasible, which are likewise within the context of the invention. In particular, the dimensions of the described layers, regions and trenches can be adjusted in accordance with particular requirements. The same is also true of the proposed dopant concentrations. Instead of using in situ doped polysilicon, polysilicon can be doped after it has been deposited. The second dielectric may be composed of other insulating materials, or may contain, for example, only SiO2.

The following text describes an exemplary method of operation for the described electrically programmable virtual-ground NOR memory cell configurations.

In order to write the logic value 1 to a transistor, a voltage of −12 volts is applied to the associated word line and a voltage of 5 volts is applied to the associated bit line. The other word lines and the other bit lines are at 0 volts. Due to the voltage drop between the word line, that is to say the control gate electrode of the transistor, and the bit line, that is to say a source/drain region of the transistor, electrons tunnel through the first dielectric from the floating gate electrode into the source/drain region. During erasing, a voltage of 0 volts is applied to the bit line while 17 volts is applied to the word line, so that electrons can tunnel from the channel region into the floating gate electrode. This corresponds to the logic value "0".

In order to read out information from the transistor, a voltage of about 2.5 volts is applied to the associated word line, this voltage being between the two possible threshold voltages of the transistor, corresponding to the logic value "0" or "1". The bit line is used to assess whether any current is flowing through the transistor.

We claim:

1. An electrically programmable memory cell configuration, comprising:
 a substrate having substantially parallel trenches formed therein, said trenches having bottoms, first flanks and second flanks opposite said first flanks;
 lower bit lines running along said bottoms of said trenches;
 upper bit lines disposed between and adjacent to respective neighboring two of said trenches;

each of said lower bit lines and each of said upper bit lines having a first part and a second part disposed parallel and adjacent to said first part, said first part and said second part each having a dopant concentration, said dopant concentration of said second part being higher than said dopant concentration of said first part, said second part of each of said lower bit lines being disposed in a region of a respective one of said first flanks, said second part of each of said upper bit lines being disposed adjacent to a respective one of said second flanks;

word lines disposed transversely with respect to said trenches in said substrate;

vertical MOS transistors having channel regions and soure/drain regions, said source/drain regions each formed of one of a part of a respective one of said upper bit lines and a part of a respective one of said lower bit lines, respective two of said vertical MOS transistors disposed next to each other along a respective one of said word lines and sharing one of a respective one of said lower bit lines and a respective one of said upper bit lines;

floating gate electrodes separated from each other and disposed on said first flanks and said second flanks;

first dielectrics separating said floating gate electrodes from said channel regions of said vertical MOS transistors;

control gate electrodes electrically connected to said word lines, said control gate electrodes being separated from each other and disposed next to each other along a respective one of said trenches; and second dielectrics separating said control gate electrodes from said floating gate electrodes.

2. The memory cell configuration according to claim 1, comprising:

insulating structures disposed adjacent to one of said first flanks and said second flanks and disposed between said first dielectrics, said first dielectrics disposed next to each other along said trenches, said floating gate electrodes overlapping said insulating structures;

said channel regions each having a channel region width, said floating gate electrodes and said control gate electrodes having dimensions in a direction parallel to paths of said trenches, said channel region width of the MOS transistors being smaller than said dimensions of said floating gate electrodes and of said control gate electrodes; and said control gate electrodes extending into said trenches.

3. The memory cell configuration according to claim 1, wherein said floating gate electrodes and said control gate electrodes have dimensions in a direction parallel to paths of said trenches, said dimensions of the control gate electrodes and of said floating gate electrodes being larger than a distance between respective two of said control gate electrodes next to each other along the trenches.

* * * * *